United States Patent [19]

Hayes

[11] Patent Number: 4,853,317
[45] Date of Patent: Aug. 1, 1989

[54] METHOD AND APPARATUS FOR SERIALIZING PRINTED CIRCUIT BOARDS AND FLEX CIRCUITS

[75] Inventor: Donald J. Hayes, Plano, Tex.
[73] Assignee: Microfab Technologies, Inc., Plano, Tex.
[21] Appl. No.: 177,131
[22] Filed: Apr. 4, 1988
[51] Int. Cl.[4] .............................. G03C 5/16
[52] U.S. Cl. ................... 430/318; 430/319; 430/327; 430/329
[58] Field of Search ............ 430/4, 5, 22, 311, 313, 430/318, 319, 327, 329

[56] References Cited

U.S. PATENT DOCUMENTS 4,522,903 6/1985 Heiart et al. .................. 430/22
4,695,527 9/1987 Geissler et al. ............... 430/256

Primary Examiner—Jose G. Dees
Attorney, Agent, or Firm—Kanz, Scherback & Timmons

[57] ABSTRACT

A method and apparatus for providing serialization of printed circuit boards and flex circuits during the normal process of manufacture of the boards and circuits is disclosed and includes a print module which prints the serializing information on the surface of the photoresist material with a fluid, which blocks the passage of ultraviolet radiation, before the photoresist material is exposed to ultraviolet radiation through the photomask. If a negative-acting photoresist material is used, the serializing information is reverse printed on the surface of the negative-acting photoresist material. If a positive-acting photoresist material is used, the serializing information is printed on the surface of the positive-acting photoresist material.

12 Claims, 3 Drawing Sheets

METHOD AND APPARATUS FOR SERIALIZING PRINTED CIRCUIT BOARDS AND FLEX CIRCUITS

BACKGROUND OF THE INVENTION

1. Field of the Invention

The present invention relates in general to printed circuit boards and flex circuits (flexible printed circuit boards). More particularly, the present invention relates to a method and apparatus for serializing printed circuit boards and flex circuits during the manufacture of such boards and circuits.

2. Description of the Prior Art

The drive toward miniaturization in the electronics industry has resulted in the need to install a greater number of electronic components and conductive leads or strips in a given area on a printed circuit board or flex circuit. This miniaturization sometimes results in a decrease in the reliability and an increase in the failure rate of the printed circuit boards and flex circuits. Various steps have been attempted in an effort to improve the reliability and decrease the failure rate of the boards and circuits. One such step is the serializing (providing serial numbers or other identifying markings) of the printed circuit boards or flex circuits so they may be traced regarding such items as manufacturing line, component suppliers, test specifications and results, etc.

In the past, attempts have been made to serialize the printed circuit boards and flex circuits by incorporating the serialization information in the photomasks used in the conventional screening or print-and-etch techniques used to layout and produce the terminals and conductive leads or strips of the printed circuit boards or flex circuits. To provide different serialization or serial numbers for each different printed circuit board or flex circuit, a different photomask must be made for each printed circuit board or flex circuit or each board or circuit will contain the identical serial number.

Since it is not economically feasible to provide a different photomask for each printed circuit board or flex circuit, other methods have been attempted in providing the desired serialization. One such method is the use of labels which contain the serialization information and which are glued onto the printed circuit board or flex circuit after the terminals and conductive leads or strips have been formed on the boards or circuits. Another method is the writing of the serial number directly onto the finished printed circuit board or flex circuit.

The present invention is intended to provide a solution to various prior art deficiencies which include the inefficiency and high cost associated with the preparation of a different photomask for each printed circuit board or flex circuit. The man hours required for the gluing of labels containing serial numbers or the painting of serial numbers on the individual printed circuit boards or flex circuits increases the manufacturing cost of the boards or circuits. Also, the labels and painted serial numbers may be damaged during subsequent manufacturing processes and work-overs associated with the boards or circuits.

SUMMARY OF THE INVENTION

The present invention provides a method and apparatus for economically and easily serializing printed circuit boards and flex circuits during the normal process of manufacture of the boards and circuits. After the insulating substrate of the printed circuit board or flex circuit has been covered, on at least one side, by a conductive foil layer which is then covered by a layer of photoresist material, the serializing information is deposited on the surface of the photoresist material by an inkjet print module which uses a fluid which blocks the passage therethrough of the radiation which polymerizes the photoresist material. If the photoresist material is the negative-acting type of photoresist, then the serializing information is reverse printed on the surface of the negative-acting photoresist material. If the photoresist material is the positive-acting type of photoresist, then the serializing information is printed on the surface of the positive-acting photoresist material in the more normal mode of printing. The serializing information may be in the form of a word, symbol, letter or a combination of symbols representing a number.

After the serializing information has been placed on the surface of the photoresist material, the photomask is placed in operative position with respect to the photoresist material. The photomask is then flooded with a light source which is rich in ultraviolet radiation and predetermined areas of the photoresist material are exposed to the ultraviolet radiation which passes through predetermined areas of the photomask. After exposure, the photoresist on the printed circuit board or flex circuit is developed to wash away the undesired areas of the photoresist. The unwanted portions of the conductive foil are then etched away leaving the predetermined paths or leads of conductive foil and the serializing information, which are formed of the conductive foil material. Then, the remaining photoresist is stripped away and the printed circuit board or flex circuit is cleaned and made ready for further processing.

The print module is operatively connected to a programmable controller through drive electronics which provides signals to the print module to control the operation thereof. The programmable controller also provides control signals to drive means which positions the printed circuit board or flex circuit relative to the print module during the printing of the serializing information.

Among the advantages offered by the present invention are a method and apparatus for serializing a printed circuit board or flex circuit during the normal steps of the manufacturing process. Available print modules may be used and can be either the continuous charge and deflect type or the drop-on-demand type of ink jet print module. A different serial number may easily be applied to each different and separate printed circuit board. Additional and different information could also be applied to each individual board or circuit.

Examples of the more important features and advantages of this invention have thus been summarized rather broadly in order that the detailed description thereof that follows may be better understood and in order that the contribution to the art may be better appreciated. There are, of course, additional features of the invention which will be described hereinafter and which will also form the subject of the claims appended hereto. Other features of the present invention will become apparent with reference to the following detailed description of a presently preferred embodiment thereof in connection with the accompanying drawing in which:

DESCRIPTION OF THE PREFERRED EMBODIMENT

Figure 1:
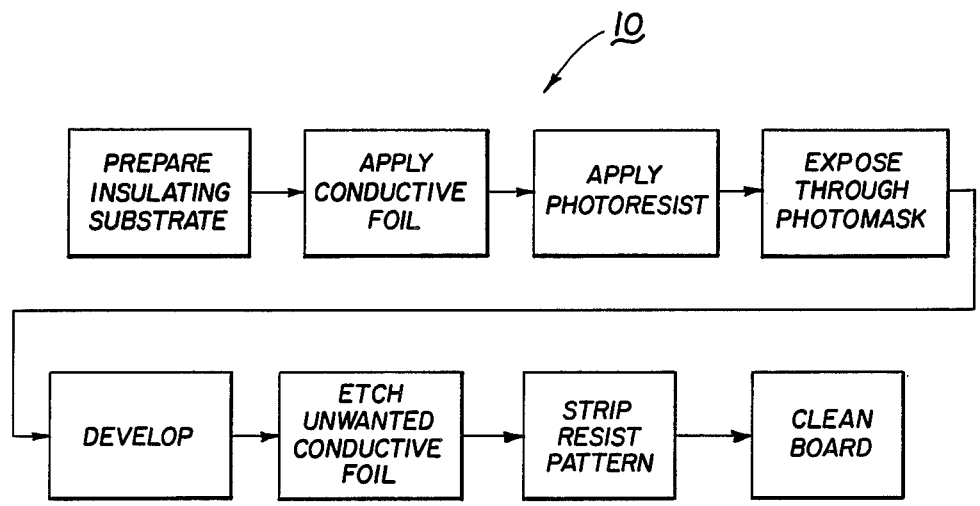
FIG. 1 is a flowchart depicting the primary steps in the manufacture of a printed circuit board or flex circuit.

Referring to the drawing, wherein like reference numerals designate like or corresponding elements throughout the several views, FIG. 1 discloses a flowchart 10 of the primary steps in the prior art manufacture of a hard or rigid printed circuit board (hereinafter referred to as a printed circuit board) or a flexible printed circuit board (hereinafter referred to a a flex circuit) using the print-and-etch process. The insulating substrate, whether it be rigid or flexible, is prepared and is then covered (at least on one side) with a layer of conductive foil. The conductive foil is usually copper which is bonded to the substrate by well known methods. A layer of photoresist material (either negative-acting or positive-acting) of predetermined thickness is then applied to the layer of conductive foil. A photomask containing the artwork for the predetermined pattern of conductive paths, strips or leads is brought into close contact or operative position with the layer of photoresist material. With the photomask in operative position, the photomask is subjected or flooded with light from a light source which is rich in ultraviolet radiation and predetermined areas of the photoresist material are exposed to the ultraviolet radiation which passes through predetermined areas of the photomask. After exposure, the photoresist on the printed circuit board or flex circuit is developed to wash away the undesired areas of the photoresist. Whether the photoresist material is negative-acting or positive-acting, the photoresist pattern remaining on the conductive foil is a positive image of the final desired copper circuit pattern (the pattern of conductive paths, strips or leads). The unwanted portions of the conductive foil are then etched away leaving the predetermined paths or leads which are formed of the conductive foil material. Then, the remaining photoresist is stripped away and the printed circuit board or flex circuit is cleaned and made ready for further processing. It will be appreciated that various primary steps may include some secondary steps such as air dry, prebake, dye, spray rinse, alcohol dip, post bake, etc.

Figure 2:
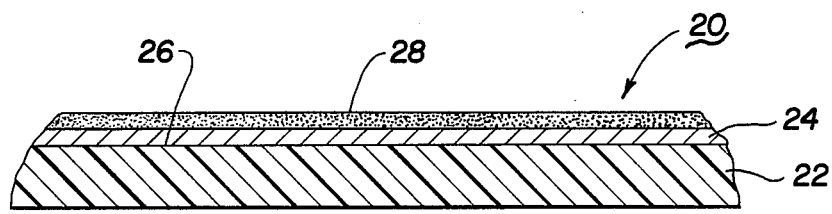
FIG. 2 is a simplified enlarged vertical sectional view of a printed circuit board during one phase of the manufacture thereof.

With reference to FIG. 2, a printed circuit board or flex circuit is referred to generally by reference numeral 20 and is depicted during a stage of the manufacture thereof and comprises an insulating substrate 22 having a conductive foil layer 24 attached to a first side 26 thereof by conventional means. The conductive foil layer 24 is then covered with a layer of photoresist material 28, of predetermined thickness, by conventional means. At this stage of the manufacturing process, the printed circuit board or flex circuit 20 is introduced to the present inventive apparatus and method for serializing the printed circuit board or flex circuit 20. It will be appreciated that serializing is meant to encompass any type of identification applied to the printed circuit board or flex circuit and includes a word, symbol, letter, or a combination of symbols representing a number, Universal Product Code (bar code), etc.

Figure 3:
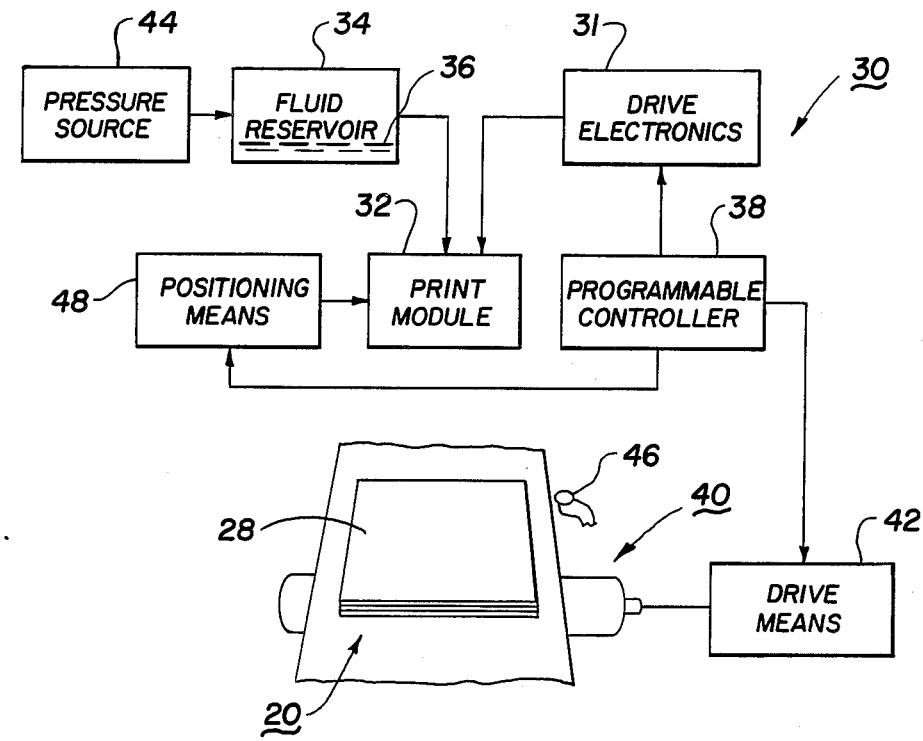
FIG. 3 is a simplified schematic and partial diagram of the apparatus of the present invention.

After the previous step or stage in the manufacture of the printed circuit board or flex circuit 20, the board or flex circuit 20 is moved relative to the serializing apparatus 30. With reference to FIG. 3, serializing apparatus 30 comprises a print module 32 operatively positioned relative to the printed circuit board or flex circuit 20. Print module 32 is operatively connected to fluid reservoir 34 containing a predetermined amount of fluid 36 which has the characteristics to block a predetermined type of radiation such as ultraviolet radiation. Programmable controller 38 is operatively connected to drive electronics 31 and transmits low level control signals to drive electronics 31 which is operatively connected to print module 32. Drive electronics 31 takes the low level control signals received from programmable controller 38 and converts them into the the proper sequence of voltage pulses of the correct amplitude to drive print module 32 to control the dispensing of drops of fluid 36 at predetermined times and to predetermined locations on the surface of the photoresist material 28 as the printed circuit board or flex circuit 20 is moved relative to the print module 32 by conveyor means 40. Conveyor means 40 receives motive power from drive means 42 which is operatively connected to programmable controller 38 which provides control signals to drive means 42 to coordinate the position of the printed circuit board or flex circuit 20 with the dispensing of drops of fluid 36 from print module 32 onto the photoresist material 28.

With further reference to FIG. 3, it will be appreciated that print module 32 may comprise a continuous charge & deflect type of print module or a drop-on-demand type of print module.

If a continuous charge & deflect type of print module is used in the serializing process, fluid reservoir 34 is structured such that it may be pressurized by pressure source 44 which is operatively connected to fluid reservoir 34. The print module 32 will also include an ink dump or "catcher"funnel 46 for the purpose of receiving ink which is "dumped" during a no-print condition rather than allowing the ink to come to rest on the photoresist material 28 or on some other unwanted location. The printing from the print module 32 onto the photoresist material 28 being controlled by programmable controller 38.

If a drop-on-demand type of print module is used in the serializing process, one embodiment of the print module 32 would be fabricated in the form of a linear array of individual ink jets with an individual jet for each pixel in the vertical dimension of the serializing information to be printed on the photoresist material 28. The line of individual jets would be positioned at right angles to the movement of the printed circuit board or flex circuit 20 and the firing of the individual jets would be controlled by programmable controller 38. Positioning means 48 would be used to position the linear array of individual ink jets to any given position on a printed circuit board or flex circuit 20. Positioning means 48 would receive control signals from the programmable controller 38. It will be appreciated that the print module 32 could comprise a single ink jet which could be moved and positioned by positioning means 48 to print the serializing information on the surface of the photoresist material 28.

As the printed circuit board or flex circuit 20 is physically moved beneath and relative to the print module 32, programmable controller 38 provides control signals to the print module 32 through drive electronics 31 and the serializing information is printed onto the surface of the photoresist material 28 at a predetermined location thereon and in a predetermined format.

Figure 4:
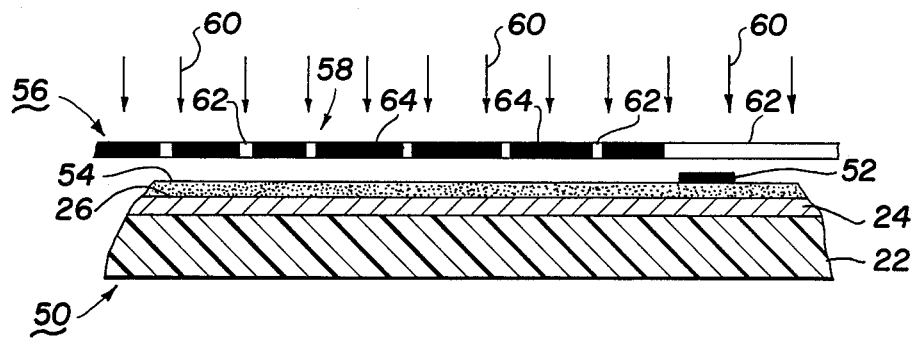
FIG. 4 is a simplified enlarged vertical sectional view of a printed circuit board during a subsequent phase of the manufacture thereof with the photomask shown displaced from the negative-acting photoresist material in order to depict the location of the serializing information on the negative-acting photoresist material.
Figure 6:
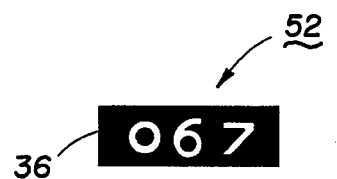
FIG. 6 is a simplified plan view of one type of serializing information in reverse printed form.

With reference to FIG. 4 (which has been enlarged and elements have been separated in order to more clearly show the inventive concept), printed circuit board or flex circuit 50 is depicted after the reverse printed serializing information 52 has been applied to the negative-acting photoresist material 54 by serializing apparatus 30 of FIG. 3. At this stage, the printed circuit board or flex circuit 50 comprises the insulating substrate 22 having a conductive foil layer 24 attached to a first side 26. A layer of negative-acting photoresist material 54 of predetermined thickness has been applied to the layer of conductive foil 24. The reverse printed serializing information 52 has been printed onto the surface of the negative-acting photoresist material 54 as is shown in FIG. 6 where fluid 36 is printed onto material 54 to outline the serializing information (in this instance, the numerals 067) so light rays will pass through the numerals 067 but will be blocked by fluid 36. Photomask 56, containing the artwork 58 for the predetermined pattern of conductive paths, strips or leads, is placed in operative position with respect to the negative-acting photoresist material 54 and is then flooded with light from a light source which is rich in ultralviolet radiation (UV) 60. The negative-acting photoresist material 54 is exposed to the ultraviolet radiation (UV) 60 through the clear areas 62 of the artwork 58. After exposure to the ultraviolet radiation (UV) 60, the negative-acting photoresist material 54 is developed to wash away the negative-acting photoresist material 54 which was below the non-clear areas 64 of the artwork 58 and did not receive the ultraviolet radiation (UV) 60. The negative-acting photoresist material 54 remains on the conductive foil 24 where it was exposed to the ultraviolet radiation (UV) 60. The portions of the conductive foil 24, which are not covered by the negative-acting photoresist material 54, are etched away which leaves the desired pattern of conductive leads formed in and of the conductive foil 24 which are covered by the negative-acting photoresist material 54. The negative-acting photoresist material 54 is then stripped from the printed circuit board or flex circuit 50 which is then cleaned.

Figure 5:
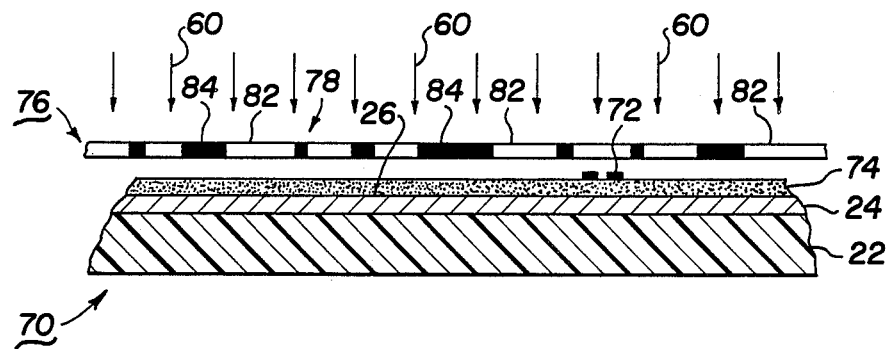
FIG. 5 is a simplified enlarged vertical sectional view of a printed circuit board during a subsequent phase of the manufacture thereof with the photomask shown displaced from the positive-acting photoresist material in order to depict the location of the serializing information on the positive-acting photoresist material.
Figure 7:
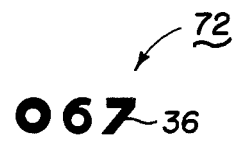
FIG. 7 is a simplified plan view of one type of serializing information in printed form.

With reference to FIG. 5 (which has been enlarged and elements have been separated in order to more clearly show the inventive concept), printed circuit board or flex circuit 70 is depicted after the printed serializing information 72 has been applied to the positive-acting photoresist material 74 by serializing apparatus 30 of FIG. 3. At this stage, the printed circuit board or flex circuit 70 comprises the insulating substrate 22 having a conductive foil layer 24 attached to a first side 26. A layer of positive-acting photoresist material 74 of predetermined thickness had been applied to the layer of conductive foil 24. The printed serializing information 72 has been printed onto the surface of the positive-acting photoresist material 74 as is shown in FIG. 7 where fluid 36 is printed onto material 74 to provide the serializing information (in this instance, the numerals 067) so light rays will not pass through the numerals 067. Photomask 76, containing the artwork 78 for the predetermined pattern of conductive paths, strips or leads, is placed in operative position with respect to the positive-acting photoresist material 74 and is then flooded with light from a light source which is rich in ultraviolet radiation (UV) 60. The positive-acting photoresist material 74 is exposed to the ultraviolet radiation (UV) 60 through the clear areas 82 of the artwork 78. After exposure to the ultraviolet radiation (UV) 60, the positive-acting photoresist material 74 is developed to wash away the positive-acting photoresist material 74 which was below the clear areas 82 of the artwork 78 and did receive the ultraviolet radiation (UV) 60. The positive-acting photoresist material 74 remains on the conductive foil 24, where it was not exposed to the ultraviolet radiation (UV) 60 because the UV radiation was blocked by the non-clear areas 84. The portions of the conductive foil 24 which are not covered by the positive-acting photoresist material 74, are etched away which leaves the desired pattern of conductive leads formed in and of the conductive foil 24 which are covered by the positive-acting photoresist material 74. The positive-acting photoresist material 74 is then stripped from the printed circuit board or flex circuit 70 which is then cleaned.

Figure 8:
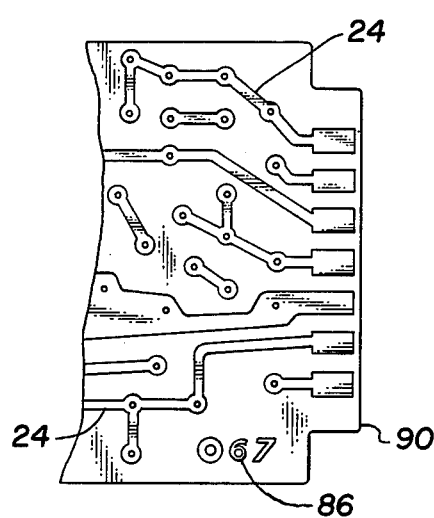
FIG. 8 is a simplified enlarged plan view of a portion of a printed circuit board incorporating the present invention.

With reference to FIG. 8, one embodiment (numerals 067) of the serializing information 86 is shown on the surface of a finished printed circuit board or flex circuit 90.

Figure 9:
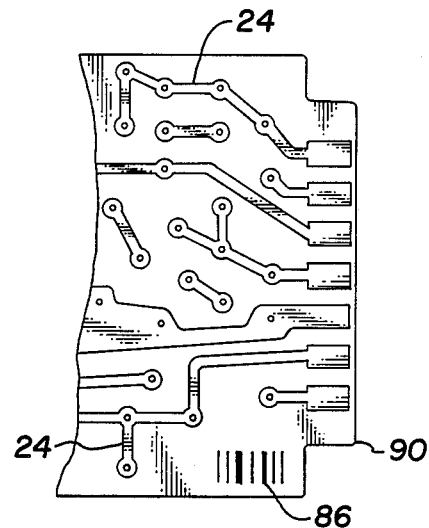
FIG. 9 is a simplified enlarged plan view of a portion of a printed circuit board incorporating an alternate embodiment of the present invention.

With reference to FIG. 9, another embodiment (Universal Product Code) of the serializing information 86 is shown on the surface of a finished printed circuit board or flex circuit 90.

Thus, it is apparent that there has been provided in accordance with this invention, a method and apparatus for serializing a printed circuit board or flex circuit which is not complex, is easily incorporated into present manufacturing facilities and is economical.

Although the present invention has been described herein with reference to specific forms thereof, it is evident that many alternatives, modifications and variations will become apparent to those skilled in the art in light of the foregoing disclosure. Accordingly, this description is to be construed as illustrative only and is for the purpose of teaching those skilled in the art the manner of carrying out the invention. It is to be understood that the forms of the invention herewith shown and described are to be taken as the presently preferred embodiments. Various changes may be made in the shape, size and arrangement of parts. For example, equivalent elements may be substituted for those illustrated and described herein, parts may be reversed, and certain features of the invention may be utilized independently of other features of the invention. It will be appreciated that various modifications, alternatives, variations, etc., may be made without departing from the spirit and scope of the invention as defined in the appended claims.

What is claimed is:

1. A method of serializing a printed circuit board or flex circuit, said method comprising the steps of:
   providing a printed circuit board or flex circuit having at least an insulating substrate which is covered on at least one side by a conductive foil layer which is covered by a layer of negative-acting photoresist material which is sensitive to a predetermined type of radiation;
   reverse printing serializing information onto a predetermined area of said layer of negative-acting photoresist material with a fluid which blocks the passage therethrough of said predetermined type of radiation;
   placing a photomask in operative position with respect to said layer of negative-acting photoresist material, said mask having at least a predetermined pattern of paths thereon which allows the passage therethrough of said predetermined type of radiation and other predetermined areas which block the passage therethrough of said predetermined type of radiation;
   irradiating said photomask with said predetermined type of radiation such that said layer of negative-acting photoresist material will be exposed by the predetermined type of radiation passing through the predetermined pattern of paths on said photomask and said reverse printed serializing information but will not be exposed where the other predetermined areas are located on the photomask;
   developing the layer of negative-acting photoresist material; and
   etching the conductive foil layer where it is not covered by the negative-acting photoresist material to provide the predetermined pattern of paths and serializing information from the conductive foil on the insulating substrate.

2. A method according to claim 1 further including removing the negative-acting photoresist material from the desired pattern of paths and the serializing information.

3. A method according to claim 2 further including cleaning the printed circuit board or flex circuit.

4. A method according to claim 1 wherein said predetermined type of radiation is ultra-violet.

5. A method according to claim 1 wherein said fluid which blocks the passage therethrough of said predetermined type of radiation comprises ink.

6. A method according to claim 1 wherein said conductive foil layer comprises copper.

7. A method of serializing a printed circuit board or flex circuit, said method comprising the steps of:
   providing a printed circuit board or flex circuit having at least an insulating substrate which is covered on at least one side by a conductive foil layer which is covered by a layer of positive-acting photoresist material which is sensitive to a predetermined type of radiation;
   printing serializing information onto a predetermined area of said layer of positive-acting photoresist material with a fluid which blocks the passage therethrough of said predetermined type of radiation;
   placing a photomask in operative position with respect to said layer of positive-acting photoresist material, said mask having at least a predetermined pattern of paths thereon which block the passage therethrough of said predetermined type of radiation and other predetermined areas which allow the passage therethrough of said predetermined type of radiation;
   irradiating said photomask with said predetermined type of radiation such that said layer of positive-acting photoresist material will be exposed by the predetermined type of radiation passing through the other predetermined areas of said photomask but will not be exposed where the predetermined pattern of paths and the printed serializing information are located on the photomask;
   developing the layer of positive-acting photoresist material; and
   etching the conductive foil layer where it is not covered by the positive-acting photoresist material to provide the predetermined pattern of paths and serializing information from the conductive foil on the insulating substrate.

8. A method according to claim 7 further including removing the positive-acting photoresist material from the desired pattern of paths and the serializing information.

9. A method according to claim 8 further including cleaning the printed circuit board or flex circuit.

10. A method according to claim 7 wherein said predetermined type of radiation is ultra-violet.

11. A method according to claim 7 wherein said fluid which blocks the passage therethrough of said predetermined type of radiation comprises ink.

12. A method according to claim 7 wherein said conductive foil layer comprises copper.

* * * * *